United States Patent

Kronenberg et al.

[11] Patent Number: 5,825,115
[45] Date of Patent: Oct. 20, 1998

[54] ELECTRIC MOTOR AND INDICATING MECHANISM, IN PARTICULAR FOR INDICATING INSTRUMENTS IN MOTOR VEHICLES

[75] Inventors: Klaus Kronenberg, Sulzbach; Sabine Vorberg, Aschaffenburg; Markus Keutz, Rossdorf; Andreas Wilhelm, Mühltal; Frank Weiand; Christian Beckhaus, both of Darmstadt; Thomas Vorberg, Aschaffenburg; Peter Schmidt, Bad Homburg; Jochen Blume, Darmstadt, all of Germany

[73] Assignee: VDO Adolf Schindling AG, Frankfurt, Germany

[21] Appl. No.: 731,627

[22] Filed: Oct. 17, 1996

[30] Foreign Application Priority Data

Oct. 20, 1995 [DE] Germany ......................... 195 39 138.1
Apr. 23, 1996 [DE] Germany ......................... 196 16 077.4

[51] Int. Cl.$^6$ ..................................................... H02K 1/12
[52] U.S. Cl. ......................... 310/254; 310/49 R; 310/89; 310/DIG. 6; 310/83; 310/42
[58] Field of Search ................... 310/254, 49 R, 310/89, DIG. 6; 29/593, 595; 116/284, 288; 324/154 PB

[56] References Cited

U.S. PATENT DOCUMENTS

| | | | |
|---|---|---|---|
| 3,978,358 | 8/1976 | Johnson et al. | 310/257 |
| 4,227,101 | 10/1980 | Malakian et al. | 310/49 R |
| 5,059,934 | 10/1991 | Sudler | 335/272 |
| 5,302,875 | 4/1994 | Taghezout | 310/156 |
| 5,531,181 | 7/1996 | Cookingham | 116/288 |
| 5,603,283 | 2/1997 | Owen | 116/284 |

FOREIGN PATENT DOCUMENTS

| | | | |
|---|---|---|---|
| 0116379 | 8/1984 | European Pat. Off. | 310/254 |
| 86056 | 4/1989 | Japan | 310/49 R |

OTHER PUBLICATIONS

Patent Abstracts of Japan, vol. 95, No. 11, Dec. 26, 1995 and JP 07 227076 A (Yazaki Corp). Aug. 22, 1995.
Patent Abstracts of Japan vol. 18, No. 515 (E–1611) Sep. 28, 1994 and JP 06 178527 A (Seiko Epson Corp), Jun. 24, 1994.

Primary Examiner—Steven L. Stephan
Assistant Examiner—Karl Eizo I. Tamai
Attorney, Agent, or Firm—Martin A. Farber

[57] ABSTRACT

An electric motor has two exciter windings, independent of each other, on a stator, by which windings a resultant magnetic field can be produced. The motor includes a permanently magnetized rotor which has at least one pair of poles, the rotor changing its position as a function of the magnetic field, and the rotor being arranged axially on a rotor shaft. In the case of an electric motor which is of a small size and easy to manufacture, the stator is developed with several arms, and has an opening present at the center to receive the rotor. The individual arms are arranged around the opening and, there are, two pairs of opposite arms. The opposite arms are so bent towards each other so that, upon their receiving a respective exciter winding, they produce magnetic vectors which are perpendicular to each other.

20 Claims, 5 Drawing Sheets

ELECTRIC MOTOR AND INDICATING MECHANISM, IN PARTICULAR FOR INDICATING INSTRUMENTS IN MOTOR VEHICLES

FIELD AND BACKGROUND OF THE INVENTION

The present invention relates to an electric motor which has two exciter windings which are independent of each other on a stator, for production of a resultant magnetic field, a permanently magnetized rotor which has at least one pair of poles and which changes its position as a function of the magnetic field and which is arranged axially on a rotor shaft, as well as a measuring mechanism for indicating instruments.

Electric motors with permanent magnetic rotors are known for many uses in a large variety of constructions. By the passage of current through the coils by means of electronic circuits, an advantageous use of such motors for positioning and indicating purposes is possible. In such connection, the electric motors are frequently operated as stepping motors.

It is known that stepping motors convert digital electrical control commands into proportional angular steps. In this connection, the rotor shaft of the stepping motor turns a specific step further upon each control pulse.

Known motors consist of an iron circuit on which there are arranged two exciter windings which are independent of each other and wound perpendicular to each other. By means of these exciter windings, there can be produced within the stator a magnetic field the position of which in space and the intensity of which are variable. A rotor rotates, depending on the stator field in each case, to the position of the smallest magnetic resistance. The rotor is fastened firmly on a rotor shaft by means of which the change in angle of the rotor is transmitted to a pointer-drive system for further processing.

In this known cross-coil arrangement, a high degree of symmetry and precision in the manufacture of the windings on the iron circuit is required. Furthermore, this construction requires a minimum size of the motor.

SUMMARY OF THE INVENTION

It is an object of the invention to provide an electric motor which is small in size and easy to manufacture.

According to the invention, the stator (19) has a multi-arm arrangement which has at its center an opening (33) to receive the rotor (13), individual arms (20a, b; 21a, b) being arranged around the opening (33) and, in each case, two opposite arms (20a, b; 21a, b) forming a pair of arms. The opposite arms (20a, b; 21a, b) are so bent with respect to each other to receive an exciter winding (22, 23) to produce magnetic force vectors which are perpendicular to each other.

The advantage of the invention resides in the fact that the magnetic force vectors which are perpendicular to each other are not, as is customarily the case, produced by the crosswise arrangement of the exciter windings but by the iron circuit which is necessary for the conducting of the magnetic flux. The shape of the iron circuit has the result that the exciter windings are arranged paraxially, which permits a smaller size of the electric motor. Further, the electric motor is easier to produce with high precision.

The four arms (20a, b; 21a, b) are preferably arranged 90° apart from each other around the opening (33).

In this connection, two opposite arms (20a, b) of the first pair of arms (20) are simply bent towards each other so that the arms (20a, b) are directed parallel to each other.

In a further development, two opposite arms (21a, b) of the second pair of arms (21) have several bends.

The arms (21a, b) of the second pair of arms have a first bend (21c) in the vicinity of the opening, and a second bend (21d) in the vicinity of the free end of each arm (21a, b).

The arms are advantageously bent approximately at a right angle.

The iron circuit is advantageously developed as a folded three-dimensional stamped/bent part.

A simple mounting of the exciter windings provides that the distance between the free ends of the arms (20a, b; 21a, b) of the pair of arms (20, 21) which are bent towards each other are so selected that in each case an exciter winding (22, 23) can be laid, coupled magnetically, between them. Each exciter winding can, for instance, be clamped between the arms of a pair of a pair of arms. As an alternative, the free ends of the arms (20a, b; 21a, b) of each pair of arms (20, 21) which are bent towards each other can have holes for the attachment of the exciter windings (22, 23). The magnetic flux coupling the exciter winding with the iron circuit of the stator is effected by the coil core of the exciter winding.

Due to different lengths of the individual arms (20a, b; 21a, b), it is possible to provide the iron circuit of the invention for different sizes of the exciter windings.

According to a feature of the invention, the stator (19) is a one-piece stamped/bent part.

The rotor (13) is preferably not aligned in axial direction with the stator (19).

In this way the required dimensional accuracy and the bearing play in axial direction can be kept within tolerance. A spring element for reduction of the axial play is not necessary.

According to another feature of the invention, the exciter windings (22, 23) are arranged in identical position.

In a further development, the electric motor of the invention is arranged in a measurement mechanism, located within a housing, together with a pointer-drive system. Between electric motor and pointer-drive system, there is a gear train (15, 16) connected between rotor shaft (14) and pointer shaft (10) for the transmission of the instantaneous position of the rotor to the pointer-drive system. There are stops (17, 18) for the mechanical adjustment of the zero point of the pointer drive system arranged both on the inner side of the housing (2) and on a spur gear (16) of the gearing (15, 16), the spur gear (16) being positioned on the pointer shaft (10).

By this arrangement, upon an initial starting of the entire system, a determination of the angular position of the pointer shaft is clearly possible. By the limitation of the angle by stop and counterstop, also upon the assembling of the pointer-drive system, the mechanical zero point of the pointer and the position of the rotor are in fixed correlation to each other.

In this way, an adjustment of the zero position of the pointer shaft is possible with a high degree of accuracy.

In one development, the housing (2) is cylindrical.

In another development, at least one detent pin (3b) is provided for fastening to a support member on at least one circular housing surface (2d) of the cylindrical housing (2). The support member is in this connection advantageously a circuit board.

This has the advantage that the measurement mechanism is secured mechanically to a support plate without additional parts by detent pins.

According to a feature of the invention, the support member is a system support with a flexible circuit board.

A further feature of the invention is that the support member is a reinforced-conductor system.

On the opposite surface of the housing (2c) there is also arranged at least one detent pin (3a) for connection to an adapter (4). The adapter has openings for the effecting of a screw connection.

According to a feature of the invention, the adapter (4) has, in addition to at least one detent receiver (5) for the detent pin (3a), openings (11) for effecting a connection to another assembly.

The arrangement of an adapter on a measurement mechanism permits a cost-favorable expansion of the field of use. Thus, for instance, bolting to other parts is possible.

In order to reduce the number of parts upon the manufacture of the measurement mechanism, it is advantageous for the housing (2) to consist of two identical halves (2a, 2b).

BRIEF DESCRIPTION OF THE DRAWINGS

With the above and other objects and advantages in view, the present invention will become more clearly understood in connection with the detailed description of preferred embodiments, when considered with the accompanying drawings, of which.

DETAILED DESCRIPTION OF THE PREFERRED EMBODIMENTS

Figure 1:
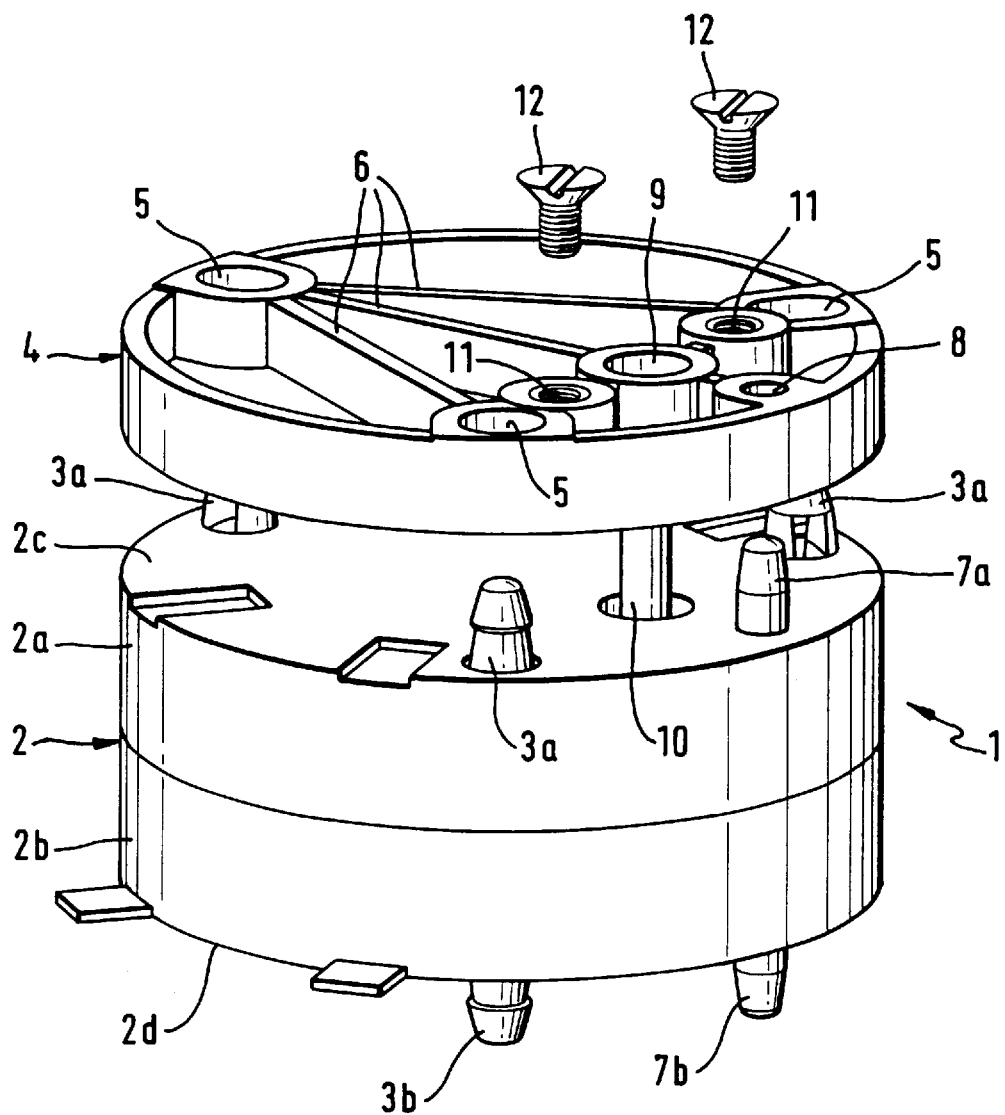
FIG. 1 is a perspective view of a measurement mechanism for pointer systems.

The measurement mechanism 1 shown in FIG. 1 is intended for use in instrument clusters in automotive vehicles where the instrument cluster is used to display data typical of the vehicle, such as, for instance, the speed or the rpm.

The measurement mechanism 1 consists of a housing 2 which is formed of two identical halves 2a and 2b. The housing 2 is cylindrical. Each housing half 2a and 2b has on its circular inside 2c, 2d, a detent pin 3a, 3b. The detent pins 3a and 3b are distributed 120° apart on the corresponding circular housing surface 2c, 2d of the housing halves 2a and 2b. By means of the detent pins 3b, the housing 2 can be fastened, and at the same time locked, on a circuit board (not shown) of the instrument cluster.

In order to effect a screw attachment to the housing 2, an adapter 4 is provided. The detent pins 3a of the housing part 2a engage in detent recesses 5 in the adapter 4 as a result of which a snap connection of the tool parts takes place. In this connection, the detent recesses 5 are distributed at the same distances apart of 120° on the adapter 4 which also has a circular contour. The recesses 5 represent in this connection the counterpart to the detent pins 3a of the housing half 2a.

The recesses 5 are furthermore stabilized with respect to each other by transverse braces 6.

Each housing half 2a, 2b, has a centering pin 7a, 7b. A centering opening 8 in the adapter 4 into which the centering pin 7a of the housing half 2a engages provides assurance that the housing 2 is connected to the adapter 4 in the correct position. The centering pin 7b fulfills this function with respect to the circuit board (not shown).

The adapter 4 has a continuous opening 9 for the pointer shaft 10 which extends out of the housing 2 and on which a pointer shaft (not further shown) is arranged.

Symmetrical to this continuous opening 9 there are two collars 11 to receive screws 12 by means of which, for instance, a dial can be fastened on the adapter 4. However, it is also conceivable that, instead of the collars 11, only openings are present and that the dial is fastened to the adapter by means of self-tapping screws.

The pointer shaft 10 is driven by a stepping motor which is arranged in the housing 2 of the measurement mechanism 1.

Figure 2:
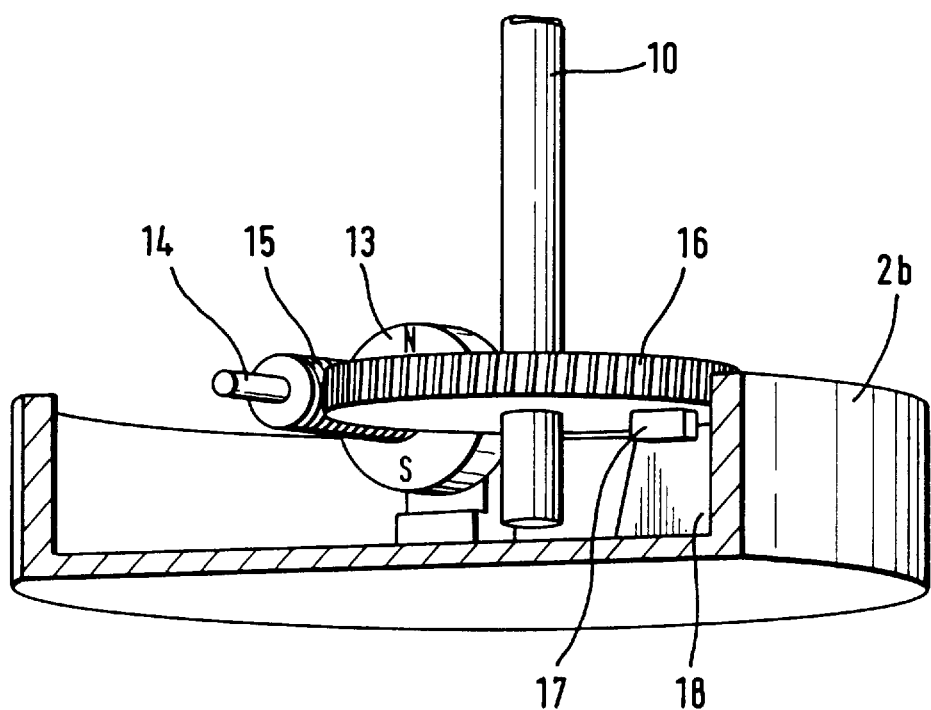
FIG. 2 shows an arrangement of the drive within the measurement mechanism.

FIG. 2 shows the mounting of the rotor system of the stepping motor in the housing half 2b of the measurement mechanism.

A magnet having two poles N, S which acts as rotor 13 is fastened on a rotor shaft 14 which bears a worm drive 15, the worm drive 15 being firmly attached to the rotor shaft 14. The worm drive 15 engages into a spur gear 16 which is fastened on the pointer shaft 10, and has a stop 17. A counterstop 18 is arranged on the inside of the housing half 2b, in the manner that, in the position of rest of the rotor 13, the stop 17 and the counterstop 18 contact each other, and the zero point of the pointer is thus mechanically fixed in unambiguous manner.

Figure 3A:
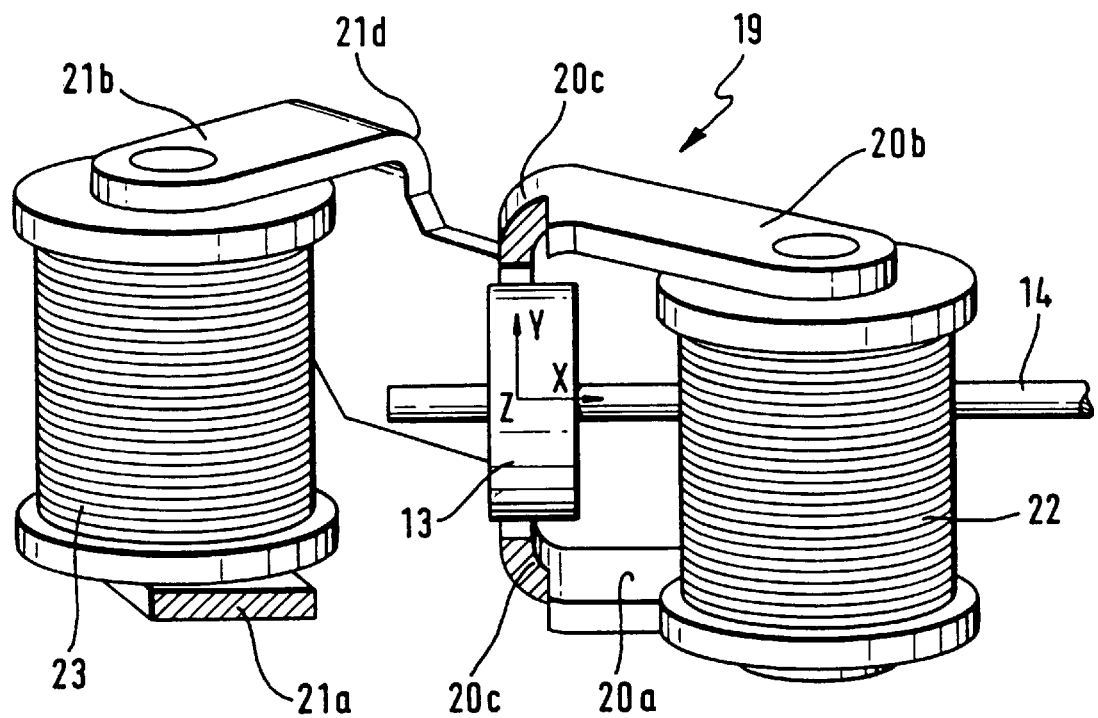
FIGS. 3a, 3b and 3c are views of components of the stator of the stepping motor.
Figure 3B:
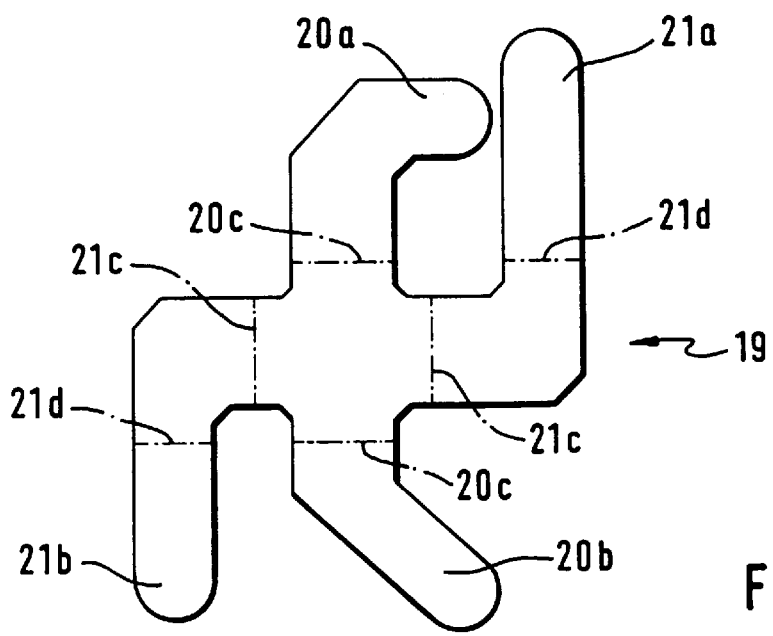
Figure 3C:
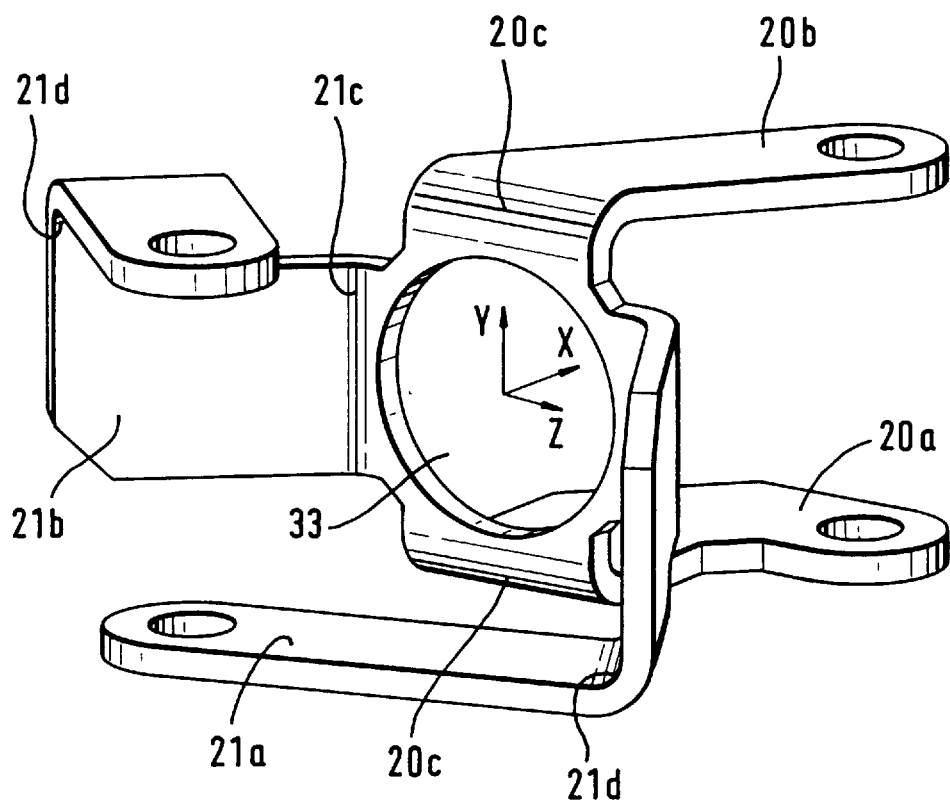

In accordance with the showing in FIG. 3a, the rotor 13 present on the rotor shaft 14 is arranged in the iron circuit 19 of a stator, the rotor shaft 14 being guided by a stator opening 33 (FIG. 3c).

In this connection, the rotor 13 is arranged on the rotor shaft 14 in such a manner that it is fastened in non-alignment with the iron circuit 19. In this way, there is produced a component of force in the direction of the rotor shaft 14, which has the result that the shaft always lies on one side in a bearing.

As shown in FIG. 3a, the stator consists of a single-piece iron circuit 19 by which the guiding of the magnetic flux for the exciting of the system takes place, as well as the exciter windings 22, 23.

The iron circuit 19 is a 4-arm arrangement, in which two opposite arms 20a and 20b form a pair of arms 20 and the arms 21a and 21b form a pair of arms 21. The arms of the pairs of arms are of different length.

In order to simplify the description of the arrangement, a three-dimensional coordinate system has been indicated in FIGS. 3a and 2.

The arms 20a and 20b are curved in the same plane (FIG. 3b) by different angles. They are bent towards each other along the line 20c in x-direction by, in each case, 90°, as shown in FIG. 3c. The arms 20a and 20b are in this connection directed parallel to each other in x-direction.

The arms 21a and 21b of the second pair of arms 21 are multiply bent towards each other.

Along the lines 21c, the arms 21a and 21b are also bent towards each other by 90°, but in opposite direction to the arms 20a and 20b of the pair of arms 20 (from y-direction into x-direction). In a further bending process along the line 21d, the free ends of the arms 21a,b are also bent 90° to each other (z-direction).

Between the arms 20a and 20b, there is a first exciter winding 22, and between the arms 21a and 21b a second exciter winding 23.

The three-dimensional stamped/bent part thus has a shape such that the magnetic force vectors arranged perpendicular to each other which are necessary for the control are obtained. The two exciter windings are in this connection arranged in the same axial direction.

In order to excite the magnetic circuit, electric energy is fed to the exciter windings 22, 23. The two exciting magnetic vectors form a resultant along which the rotor 13 aligns itself. The change in angle of the rotor 13 is transmitted by the rotor shaft 14 to the pointer drive system. This is effected via the worm drive 15 which is arranged fixed on the rotor shaft and engages into the spur wheel 16. Since the spur wheel 16 is fixed on the pointer shaft 10, the pointer shaft 10 turns corresponding to the change in angle of the rotor 13. The change in angle is indicated by a pointer connected to the pointer shaft 10.

For the exciting of the magnetic circuit, current pulses are fed to the exciter windings 22, 23 via the conductive paths of a circuit board, which may also be developed as a flexible conductor foil or a reinforced-conductor system.

Figure 4:
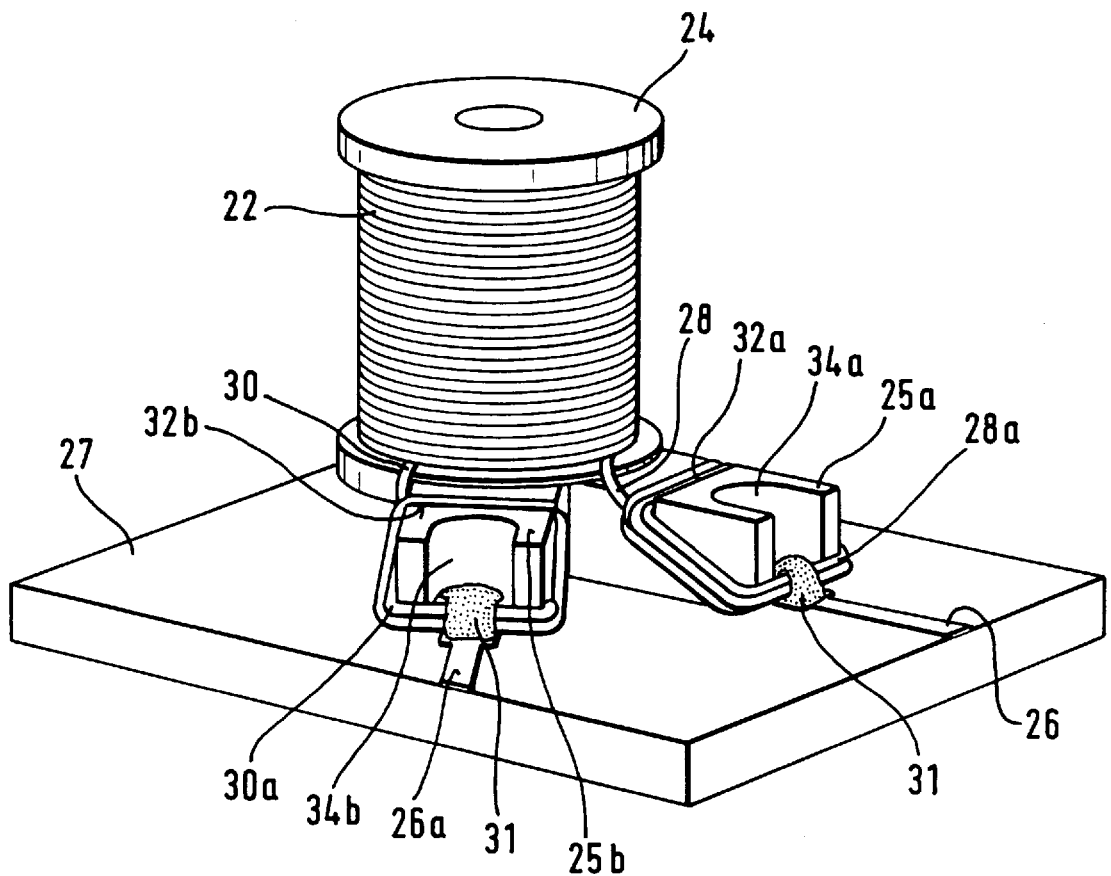
FIG. 4 is a perspective view showing a contacting of an exciter winding on a circuit board.

The basic contacting of an exciter winding 22 is shown in FIG. 4.

This coil form 24 has two electrically insulating contact feet 25a and 25b which are fastened in one plane at one end of the coil form 26 parallel to the exciter winding 22. The contact feet 25a and 25b are of identical construction. They are forked shaped in such a manner that they have a recess 34a, 34b in the direction opposite the coil form 24, said recess being open to the conductive path 26, 26a of the circuit board 27.

Below the fork-shaped contact fork, there is a guide in the form of a groove for windings 28a, 30a of the winding end 28, 30 which are guided around the contact foot. In the direction of the exciter winding 22 between coil form 24 and the recess 34a, 34b, each of the contact feet 25a and 25b has a recess 32a and 32b respectively for the fastening of the windings 28a and 30a respectively on the corresponding contact foot.

Upon manufacture, a first end 28 of the exciter winding 22 is wound several times around the first contact foot 25a so that the windings 28a contact the conductive path 26.

After the wrapping of the first contact foot 25a, the coil form 24 is provided with the coil winding 22. Thereupon, the second contact foot 25b is wrapped in the same manner as the first contact foot 25a with the second coil end 30.

For the contacting of terminals of the coil winding 22 with conductors of a circuit board 27, the contact feet 25a and 25b are placed on the circuit board 27 and connected electrically to the conductive path 26, 26a of the circuit board 27. The winding ends 28a in this connection contact the conductive path 26, and the winding ends 30a contact the conductive path 26a.

The contacting of the windings 28a and 30a of the two coil ends 28 and 30 respectively is effected via a solder connection 31.

The fork-shaped development permits the accumulation of contact paste, in the present case solder paste, and thus assure a reliable contacting of the conductive paths with the winding ends.

In addition to an automatic soldering process, the contacting, however, can also be effected by conductive paste.

We claim:

1. An electric motor comprising:
   a stator, and two exciter windings which are independent of each other and are disposed on the stator, said windings producing magnetic fields;
   a rotor shaft, and a permanently magnetized rotor which has at least one pair of poles and which changes its position as function of the magnetic fields, the rotor being arranged fixed axially on the rotor shaft;
   wherein said stator has a multi-arm arrangement including a plurality of arms and an opening at a center of the multi-arm arrangement to receive said rotor, said multi-arm arrangement having first and second opposed surfaces extending parallel to a plane of said opening in a region of said opening;
   there being first and second pairs of said arms, said arms of each pair of said arms being oppositely arranged around said opening;
   the opposite arms of each of the respective pairs are bent with respect to each other to receive an exciter winding, exciter windings of said respective pairs of arms producing magnetic force vectors which are perpendicular to each other;
   in said first pair of arms, each arm is bent about a bend line to bring the first surface of one arm of said first pair offset from and in facing relation to the first surface of a second arm of said first pair, the bend line of each of said arms lying in said plane of said opening;
   in said second pair of arms, each arm is bent about a first bend line and a second bend line to bring the second surface of one arm of said second pair offset from and in facing relation to the second surface of a second arm of said second pair; and
   in each of said arms, of said second pair of arms the first bend line lies in said plane of said opening and is perpendicular to said second bend line.

2. A motor according to clam 1, wherein said multi-arm arrangement comprises the four arms, which are arranged 90° apart from each other around said opening.

3. A motor according to claim 1, wherein, two opposite arms of a first pair of said arms are bent towards each other to be parallel to each other.

4. A motor according to claim 3, wherein, two opposite arms of a second pair of said arms have several bends.

5. A motor according to claim 4, wherein the arms of said second pair of arms have, in said several bends, a first bend in a vicinity of said opening, and a second bend in a vicinity of a free end of each arm of said second pair of arms.

6. A motor according to claim 1, wherein
   in each of said pairs of arms, the arms are bent toward each other, and the distance between the free ends of the arms is selected to receive an exciter winding coupled magnetically, between them.

7. A motor according to claim 6, wherein, in each of said pairs of arms, the free ends of the arms have holes for the attachment of the exciter windings.

8. A motor according to claim 6, wherein
   in each of said pairs of arms, the individual arms have different lengths to receive exciter windings differing in their overall physical dimensions.

9. A motor according to claim 1, wherein the stator is a one-piece stamped/bent part.

10. A motor according to claim 1, wherein the rotor is not aligned in axial direction with an axis of the stator.

11. A motor according to claim 1, wherein said exciter windings are arranged in identical orientation.

12. An indicating mechanism comprising a housing with an electric motor therein, a pointer-drive system with a pointer shaft, a gear train connected between a rotor of the motor and the pointer-drive system, a first stop and a second stop;

wherein the motor comprises:
- a stator, and two exciter windings which are independent of each other and are disposed on the stator, said windings producing magnetic fields;
- a rotor shaft, and a permanently magnetized rotor which has at least one pair of poles and which changes its position as function of the magnetic fields, the rotor being arranged fixed axially on the rotor shaft;
- wherein said stator has a multi-arm arrangement including a plurality of arms and an opening at a center of the multi-arm arrangement to receive said rotor, said multi-arm arrangement having first and second opposed surfaces extending parallel to a plane of said opening in a region of said opening;
- there being first and second pairs of said arms, said arms of each pair of said arms being oppositely arranged around said opening;
- the opposite arms of each of the respective pairs are bent with respect to each other to receive an exciter winding, exciter windings of said respective pairs of arms producing magnetic force vectors which are perpendicular to each other;
- in said first pair of arms, each arm is bent about a bend line to bring the first surface of one arm of said first pair offset from and in facing relation to the first surface of a second arm of said first pair, the bend line of each of said arms lying in said plane of said opening;
- in said second pair of arms, arms each arm is bent about a first bend line and a second bend line to bring the second surface of one arm of said second pair offset from and in facing relation to the second surface of a second arm of said second pair;
- in each of said arms, of said second pair of arms the first bend line lies in said plane of said opening and is perpendicular to said second bend line;
- said gear train has a first gear connected to said rotor shaft, and a spur gear connected to said pointer shaft;
- said gear train serves for a transmission of instantaneous position of said rotor to said pointer-drive system;
- said first stop is located on said housing, and said second stop is located on said spur gear; and
- said first stop and said second stop provide a mechanical adjustment of a zero point of the pointer drive system.

13. A mechanism according to claim 12, wherein
said housing is cylindrical.

14. A mechanism according to claim 13, wherein said housing comprises a support member disposed on a circular housing surface of said housing; and
- said mechanism further comprises at least one detent pin for fastening said support member on said circular housing surface.

15. A mechanism according to claim 14, wherein said support member is a circuit board.

16. A mechanism according to claim 14, wherein
said support member is a system support with a flexible circuit board.

17. A mechanism according to claim 14, wherein said support member is a reinforced-conductor system.

18. A mechanism according to claim 14, further comprising a second detent pin disposed on an opposite surface of said housing for connection to a further adapter.

19. A mechanism according to claim 13, wherein
said adapter comprises a receiver for said detent pin and an opening for effecting a connection to another assembly.

20. A mechanism according to claim 12, wherein said housing comprises two identical halves.

* * * * *